(12) United States Patent
Richter et al.

(10) Patent No.: US 8,697,584 B2
(45) Date of Patent: Apr. 15, 2014

(54) ENHANCED TRANSISTOR PERFORMANCE OF N-CHANNEL TRANSISTORS BY USING AN ADDITIONAL LAYER ABOVE A DUAL STRESS LINER IN A SEMICONDUCTOR DEVICE

(75) Inventors: Ralf Richter, Dresden (DE); Andy Wei, Dresden (DE); Roman Boschke, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1451 days.

(21) Appl. No.: 12/017,175

(22) Filed: Jan. 21, 2008

(65) Prior Publication Data

US 2008/0296693 A1 Dec. 4, 2008

(30) Foreign Application Priority Data

May 31, 2007 (DE) .......................... 10 2007 025 342

(51) Int. Cl.
 *H01L 21/31* (2006.01)
(52) U.S. Cl.
 USPC ........................................................ 438/783
(58) Field of Classification Search
 USPC ........................................ 257/396; 438/783
 See application file for complete search history.

(56) References Cited

U.S. PATENT DOCUMENTS

| | | | |
|---|---|---|---|
| 2002/0142539 A1* | 10/2002 | Tu et al. ........................ | 438/239 |
| 2005/0042860 A1* | 2/2005 | Daniels et al. ................ | 438/637 |
| 2005/0214998 A1 | 9/2005 | Chen et al. .................... | 438/199 |
| 2005/0260806 A1* | 11/2005 | Chang et al. .................. | 438/197 |
| 2006/0003510 A1 | 1/2006 | Kammler et al. ............. | 438/198 |
| 2006/0046400 A1* | 3/2006 | Burbach et al. .............. | 438/282 |
| 2006/0091471 A1 | 5/2006 | Frohberg et al. ............. | 257/369 |
| 2006/0113641 A1 | 6/2006 | Hohage et al. ................ | 257/640 |
| 2006/0199326 A1 | 9/2006 | Zhu et al. ...................... | 438/201 |
| 2006/0226490 A1 | 10/2006 | Burnett et al. ................ | 257/365 |
| 2006/0228848 A1 | 10/2006 | Chan et al. .................... | 438/199 |
| 2006/0246641 A1* | 11/2006 | Kammler et al. ............. | 438/184 |
| 2006/0267106 A1* | 11/2006 | Chao et al. .................... | 257/382 |
| 2007/0069256 A1 | 3/2007 | Morin et al. .................. | 257/288 |
| 2007/0090455 A1 | 4/2007 | Lim et al. ...................... | 257/338 |
| 2007/0235823 A1* | 10/2007 | Hsu et al. ...................... | 257/411 |

FOREIGN PATENT DOCUMENTS

| | | | |
|---|---|---|---|
| DE | 2005046974 | 4/2007 | |
| WO | WO 2007/054403 | 5/2007 | ............ H01L 21/336 |

OTHER PUBLICATIONS

Official Communication Dated Jan. 18, 2008 for Serial No. 10 2007 025 342.9-33.
PCT Search Report from PCT/US2008/006751 dated Sep. 12, 2008.

* cited by examiner

*Primary Examiner* — Yu-Hsi D Sun
(74) *Attorney, Agent, or Firm* — Amerson Law Firm, PLLC

(57) ABSTRACT

By forming an additional dielectric material, such as silicon nitride, after patterning dielectric liners of different intrinsic stress, a significant increase of performance of N-channel transistors may be obtained while substantially not contributing to a performance loss of the P-channel transistor.

23 Claims, 4 Drawing Sheets

ENHANCED TRANSISTOR PERFORMANCE OF N-CHANNEL TRANSISTORS BY USING AN ADDITIONAL LAYER ABOVE A DUAL STRESS LINER IN A SEMICONDUCTOR DEVICE

BACKGROUND OF THE INVENTION

1. Field of the Invention

Generally, the present disclosure relates to the field of integrated circuits, and, more particularly, to the manufacturing of field effect transistors on the basis of stressed dielectric layers formed above the transistors, such as stressed contact etch stop layers used for generating a different type of strain in channel regions of different transistor types.

2. Description of the Related Art

Integrated circuits are typically comprised of a large number of circuit elements located on a given chip area according to a specified circuit layout, wherein, in complex circuits, the field effect transistor represents one predominant circuit element. Generally, a plurality of process technologies are currently practiced, wherein, for complex circuitry based on field effect transistors, such as microprocessors, storage chips and the like, CMOS technology is one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, has been a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of different transistor elements by adjusting the stress characteristics of a dielectric layer stack that is formed above the basic transistor structure. The dielectric layer stack typically comprises a dielectric layer which may be located close to the transistor and which may also be used in controlling a respective etch process in order to form contact openings to the gate and drain and source terminals. Therefore, an effective control of mechanical stress in the channel regions, i.e., effective stress engineering, may be accomplished by individually adjusting the internal stress of this layer, which may also be referred to as contact etch stop layers, and by positioning a contact etch contact layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition processes (PECVD) above the transistor, i.e., above the gate structure and the drain and source regions, wherein, for instance, silicon nitride may be used due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher of compressive stress and up to 1 GPa and significantly higher of tensile stress, wherein the type and the magnitude of the intrinsic stress may be efficiently adjusted by selecting appropriate deposition parameters. For example, ion bombardment, deposition pressure, substrate temperature, gas flow rates and the like represent respective parameters that may be used for obtaining the desired intrinsic stress.

During the formation of the two types of stressed layers, conventional techniques may suffer from reduced efficiency when device dimensions are increasingly scaled by using the 65 nm technology and even further advanced approaches, due to the limited conformal deposition capabilities of the deposition process involved, which may result in respective process non-uniformities during subsequent process steps for patterning the stressed layer and forming contact openings, as will be explained in more detail with reference to FIG. 1a-1c.

FIG. 1a schematically illustrates a cross-sectional view of a semiconductor device 100 in a certain manufacturing stage for forming stress-inducing layers above a first device area 120A and a second device area 120B. The first and second device areas 120A, 120B, which typically represent respective transistor elements, may be formed above a substrate 101 comprising a semiconductor layer 102, such as a silicon-based layer, which may be separated from the substrate 101 by an appropriate buried insulating layer, if a silicon-on-insulator (SOI) configuration is considered. In the example shown, the first and second device areas 120A, 120B may comprise a plurality of transistor elements with a lateral distance according to the design rules of the technology under consideration. The transistors in the first and second device regions 120A, 120B may comprise a gate electrode 121 formed on a respective gate insulation layers 123, which separates the gate electrode 121 from a corresponding channel region 124, which is laterally located between respective drain/source regions 125. Furthermore, a sidewall spacer structure 122 may be formed on sidewalls of the gate electrode 121. Typically, metal silicide regions (not shown) may be provided in the drain and source regions 125 and the gate electrodes 121 in order to enhance the conductivity of these areas. The semiconductor device 100 may represent an advanced device, in which critical dimensions, such as the gate length, i.e., in FIG. 1a, the horizontal extension of the gate electrodes 121, may be approximately 50 nm or significantly less. Consequently, a distance between respective transistor elements, i.e., the lateral distance between neighboring sidewall spacer structures 122 of closely spaced transistor elements, may be approximately 100 nm or even less, wherein, depending on the device configuration, in dense device areas, a plurality of closely spaced circuit elements may be provided.

It should be appreciated that the first and second device regions 120A, 120B may be separated by an appropriate isolation structure (not shown) if required. Furthermore, in the manufacturing stage shown in FIG. 1a, a silicon nitride layer 130 comprising a high intrinsic stress may be formed above the first and second device regions 120A, 120B, followed by an etch indicator layer 131 comprised of silicon dioxide. It should be appreciated that, if required, an etch stop layer, such as a silicon dioxide layer of appropriate thickness and density, may be provided between the silicon nitride layer 130 and the respective transistor elements in the first and second device regions 120A, 120B.

As is evident from FIG. 1a, due to the reduced spacing between neighboring transistor elements, the silicon nitride layer 130 may define a respective surface topography in which tapered recesses, also referred to as seams 132, may be formed between the closely spaced transistor elements, since the spacing between the transistor elements may be in the order of two times a layer thickness of the silicon nitride layer 130, which, in combination with the limited conformal fill behavior, may even result in corresponding defects, such as voids 132A and the like. Moreover, due to the pronounced surface topography at the seams 132, the silicon dioxide layer 131 may have a significantly increased thickness at this area, due to locally different deposition conditions compared to other areas, which may further contribute to etch non-uniformities during the subsequent patterning of the layer 130.

Furthermore, in this manufacturing stage, the semiconductor device 100 may comprise a resist mask 103, exposing the first device region 120A, while covering the second device region 120B. In this case, it may be assumed that the intrinsic stress of the silicon nitride layer 130 may be appropriately selected to enhance the transistor performance in the second device region 120B.

A typical process flow for forming the semiconductor device 100 as shown in FIG. 1a may comprise the following processes. The gate electrodes 121 and the gate insulation layers 123 may be formed and patterned on the basis of well-established process techniques including advanced photolithography, deposition, oxidation and etch techniques. Thereafter, the drain and source regions 125 may be formed in combination with the sidewall spacer structures 122 on the basis of well-established deposition, anisotropic etch processes and implantation sequences in order to establish the desired vertical and lateral dopant profile. Thereafter, respective silicide regions may be formed, if required, on the basis of well-established techniques. Next, if required, a corresponding silicon dioxide etch stop layer may be formed, followed by the deposition of the silicon nitride layer 130. During the deposition of the silicon nitride material, respective process parameters, such as composition of carrier gases and reactive gases, substrate temperature, deposition pressure and in particular ion bombardment during the deposition, may significantly influence the finally obtained intrinsic stress of the material as deposited with respect to the underlying materials. Thus, by selecting appropriate parameter values, a high degree of intrinsic stress, such as up to 2 GPa and even more of compressive stress or up to 1 GPa or even significantly higher of tensile stress, may be created to enhance the performance of the transistor in the first device region 120A. Due to the less pronounced conformality of the silicon nitride deposition process above, a certain layer thickness and for increased aspect ratios, as may be occur in highly scaled devices caused by the reduced distance between the neighboring transistor elements at moderately dimensioned gate heights in densely packed device areas, as shown, the silicon nitride material may merge in the lateral growth direction between closely spaced transistor elements, thereby forming the respective seam 131, or respective overhangs may form, thereby resulting in the void 132A. Thus, in the subsequent deposition of the silicon dioxide layer 132, the local deposition conditions at the seam 131 may result in a non-uniformity of the layer thickness, thereby creating a locally significantly enhanced silicon dioxide thickness, which may even amount to a thickness of up to three to four times the thickness at areas distant from the seam 131. On the other hand, the void 132A may give rise to respective etch non-uniformities in a contact etch process to be performed in a later stage.

After the deposition of the silicon dioxide layer 132, the resist mask 103 may be formed on the basis of well-established photolithography techniques. Next, an appropriately designed etch process may be performed in order to remove a portion of the layers 130 and 131 from the first device region 120A. During the corresponding etch process, the silicon dioxide material of the layer 131 may be removed first followed by a selective etch process for removing the material of the silicon nitride layer 130, wherein the corresponding etch process may be controlled on the basis of an etch stop layer, if required. Due to the significantly increased layer thickness of the silicon dioxide layer 131 at the seam 132, the material may not be completely removed during the etch process when removing the layer 131, thereby significantly blocking the selective etch chemistry during the subsequent etch process for removing the exposed portion of the silicon nitride layer 130.

Consequently, respective material residuals may remain between the transistors in the first device region 120A, which may result in respective non-uniformities during the further processing, for instance, during the deposition of a further dielectric layer of high intrinsic stress designed to enhance the transistor performance of the transistors in the first device region 120A.

FIG. 1b schematically illustrates the semiconductor device 100 at a further advanced manufacturing stage. As shown, a second dielectric layer 140 may be formed above the first and second device regions 120A, 120B, with a corresponding material residual, also referred to as 132, and consisting of material of the layer 131 and 130, while the respective defects, that is, a void 132A, may still be present in the second device region 120B. Consequently, due to the material residual 132, which may be comprised of different materials and may have a different type of intrinsic stress compared to the surrounding material of the layer 140, as previously explained, the respective stress transfer mechanism may be deteriorated, while, additionally, the residual 132 may provide respective etch non-uniformities in the subsequent patterning sequence for forming respective contact openings. Similarly, the void 132A in the second device region 120B may also result in a reduced stress transfer mechanism, as well as degraded etch uniformity, during the subsequent processing. Furthermore, at the manufacturing stage shown in FIG. 1b, a corresponding resist mask 104 is provided for protecting the dielectric layer 140 during a corresponding etch process 105 for removing the exposed portion of the layer 140 in the second device region 120B.

With respect to the formation of the second dielectric layer 140, substantially the same criteria apply as previously explained with respect to the layer 130. Hence, during the deposition of the layer 140, respective process parameters may be adjusted in an appropriate manner so that a desired high intrinsic stress may be obtained. In sophisticated applications, i.e., in semiconductor devices of feature sizes of approximately 50 nm and less, the gap fill capabilities of the deposition process for forming the layer 140 may also play an important role during the etch process 105, since, in combination with the surface topography generated during the deposition of the layer 130, a substantially complete removal of the exposed portion of the layer 140 may depend on the deposition capabilities of the subsequent deposition for a given device geometry. Hence, the thickness of the layer 140 may have to be within specified limits in order to substantially completely remove the layer 140 of the second device region 120B, while not unduly affecting the overall stress transfer mechanism. Thus, a respective high degree of conformality may be required for the deposition of the layer 140 in order to efficiently remove the exposed portion thereof by the process 105, which may be controlled on the basis of the etch indicator 131, thereby requiring a moderately uniform layer thickness for substantially completely removing the material of the layer 140 without unduly removing the material of the layer 130.

FIG. 1c schematically illustrates the device 100 at a further advanced manufacturing stage, wherein a corresponding interlayer dielectric material 150, for instance comprised of silicon dioxide, may be formed above the first and second dielectric layers 130, 140. The dielectric material 150 may be formed on the basis of well-established techniques, such as sub-atmospheric deposition processes on the basis of TEOS and the like, which may be followed by respective planarization processes, if required. Thereafter, respective contact openings 151 may be formed, which may in some cases, for instance in dense RAM regions, connect to the device layer at areas located between respective closely spaced transistors. Thus, the corresponding irregularities 132, 132A may also affect the corresponding process, thereby resulting in less reliable contacts or even total contact failures.

As a consequence, upon further device scaling, the respective limitation of deposition processes for dielectric materials of high intrinsic stress may require a reduction of the layer thickness to comply with increased aspect ratios encountered in advanced device geometries. However, in this case, the respective strain induced by the stressed dielectric materials may also be significantly reduced, thereby also reducing transistor performance. It is, therefore, an important design criterion to enhance the operating speed of the transistors in logic areas, despite the continuous reduction of the device dimensions, thereby requiring the above-described adaptation of the dual stress liner approach with respect to material reduction to comply with the reduced pitch between neighboring devices.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein addresses the problem of a reduced efficiency of strain-inducing mechanisms in highly scaled semiconductor devices by providing an enhanced stress liner approach for increasing the speed of N-channel transistors, thereby also enhancing the overall speed of logic CMOS devices. To this end, the patterning sequence of forming differently stressed dielectric layers above respective transistor devices is designed to comply with the reduced device dimensions while enhancing the transistor performance of the N-channel transistors. That is, the patterning sequence for providing two differently stressed dielectric layers may be performed on the basis of process parameters that enable a highly efficient deposition of both dielectric materials, wherein, after the removal of unwanted portions of these layers, at least one further dielectric material etch stop material, having a significantly reduced internal stress level compared to the previously formed etch stop materials, may be formed within the corresponding process margins, thereby reducing any patterning-induced non-uniformities during the further processing while significantly enhancing the strain-inducing mechanism of the N-type transistor. Consequently, the respective process sequence may be readily adapted to any further scaled devices once an appropriate patterning regime for differently stressed dielectric layers has been established.

One illustrative method disclosed herein comprises forming a first stress-inducing layer above a first transistor formed above a substrate, wherein the first stress-inducing layer generates a first type of stress. The method further comprises forming a second stress-inducing layer above a second transistor, wherein the second stress-inducing layer generates a second type of stress other than the first type of stress. Moreover, a third dielectric layer is formed above the first and second transistors, wherein the third dielectric layer has an internal stress level above the first transistor that is less than that of the first and second stress-inducing layers. Furthermore, an interlayer dielectric material is formed above the first and second transistors, and contact openings connecting to the first and second transistors are formed by using the first and second stress-inducing layers and the third dielectric layer as an etch stop material.

Another illustrative method disclosed herein comprises forming a first dielectric layer above a P-channel transistor, wherein the first dielectric layer induces a compressive strain in a channel region of the P-channel transistor. The method further comprises forming a second dielectric layer above an N-channel transistor, wherein the second dielectric layer induces a tensile strain in a channel region of the N-channel transistor. Moreover, the method comprises forming a third dielectric layer above the P-channel transistor and the N-channel transistor, wherein the third dielectric layer has an internal stress level that is less than an internal stress level of the first and second dielectric layers. Additionally, an interlayer dielectric material is deposited above the third dielectric layer.

An illustrative semiconductor device disclosed herein comprises a first dielectric layer formed above a first transistor, wherein the first dielectric layer induces a first type of stress. The device further comprises a second dielectric layer formed above a second transistor, wherein the second dielectric layer induces a second type of stress other than the first type of stress. Moreover, the semiconductor device further comprises a third dielectric layer formed on the first and the second dielectric layers, wherein the third dielectric layer has an internal stress level that is less than an internal stress level of the first and second dielectric layers. The semiconductor device further comprises an interlayer dielectric material formed above the third dielectric layer, wherein a thickness of the interlayer dielectric material is greater than a combined thickness of the first and third dielectric layers.

BRIEF DESCRIPTION OF THE DRAWINGS

The disclosure may be understood by reference to the following description taken in conjunction with the accompanying drawings, in which like reference numerals identify like elements, and in which.

Figure 1A:
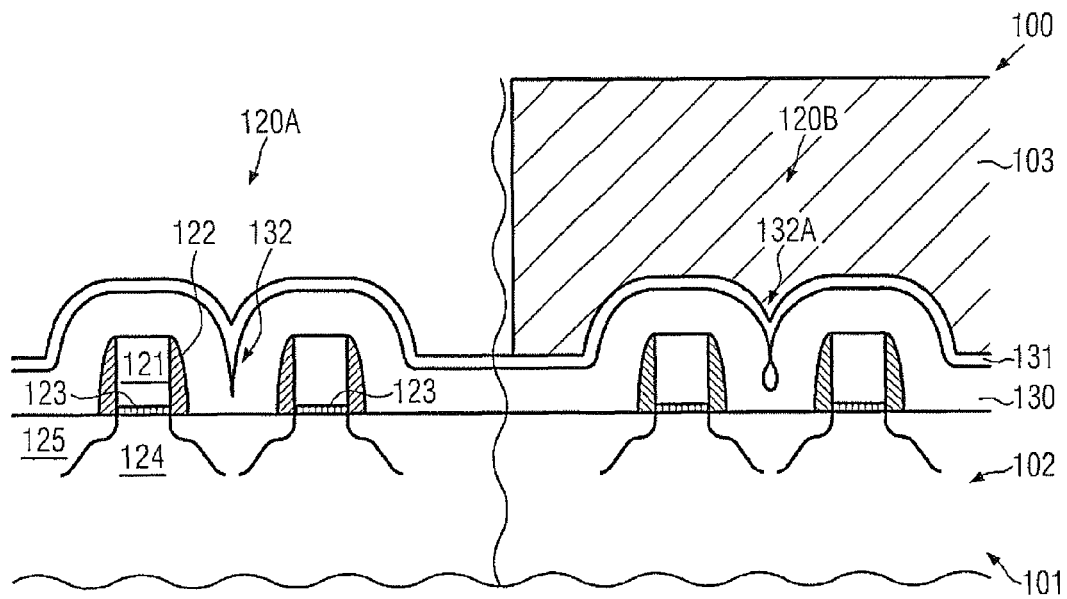
FIGS. 1a-1c schematically illustrate cross-sectional views at various manufacturing stages in forming differently stressed contact etch stop layers in a semiconductor device including densely spaced transistor elements, according to a conventional method.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to an enhanced process technique for forming stress-inducing layers above device regions which may include densely spaced transistor elements on the basis of a dual stress liner approach with enhanced scalability. A dual stress liner approach may be understood as a sequence of depositing a first stress-inducing material of a first type of intrinsic stress, patterning the first material to remove it from unwanted device areas, depositing a second stress-inducing material of a second type of stress and removing the second material from above the first material. According to aspects disclosed herein, the capabilities of the deposition process, possibly in combination with subsequent patterning regimes for forming the highly stressed dielectric materials, are taken into consideration in order to significantly reduce any non-uniformities during the patterning sequence and during subsequent process steps for forming a respective contact structure, by extending the dual stress liner sequence by forming an additional dielectric material, which, in illustrative embodiments, is comprised of silicon nitride, above the previously formed stressed liners, wherein the additional dielectric layer has a lower internal stress level compared to the stressed liners, thereby forming an efficient "buffer" layer for enclosing the stressed liners. The provision of the additional dielectric layer, which may be comprised of a the same or similar material compositions as the stressed liners, has been found to result in a significant gain inn performance of N-channel transistors, while substantially not affecting the P-channel transistor. Thus, the stressed liners may be efficiently formed on the basis of process parameters to comply with stress and device requirements for highly scaled devices, that is, a conform layer of highly stressed material may be provided while respecting the gap fill capabilities of the deposition process for forming the stressed liners, while the additional layer of reduced stress level, or with a substantially neutral stress behavior, results in an efficient stress transfer of the tensile stress in the N-channel transistor. In some aspects, the additional dielectric layer may be selectively provided in circuit areas including logic circuitry, such as CPU cores and the like, in order to enhance the tensile strain therein, while in other areas, such as RAM (random access memory) areas, the additional dielectric layer may be provided with a moderately high compressive stress, if desired. The additional dielectric layer thus allows forming the actual stress liners with enhanced uniformity, thereby also enhancing the uniformity of the subsequent patterning of contact openings in a corresponding interlayer dielectric material, wherein the stress liners and the additional dielectric layer may act as an etch stop. In some illustrative embodiments, an additional liner may be formed prior to depositing the additional dielectric layer, wherein the liner may be used to enhance the control of the etch process for opening the dielectric stack comprising the stress liners and the dielectric layer, wherein the additional liner may not substantially affect the buffering effect of the additional dielectric layer.

In other illustrative embodiments, the additional stressed dielectric material may be provided as an efficient buffer material, while concurrently providing a different optical response during an etch process for etching through the dielectric layer stack comprised of the stress liners and the additional dielectric layer, thereby providing high etch stop capabilities when forming the contact openings in the overlying interlayer dielectric material and also resulting in enhanced etch controllability when etching through the additional dielectric layer.

Figure 2A:
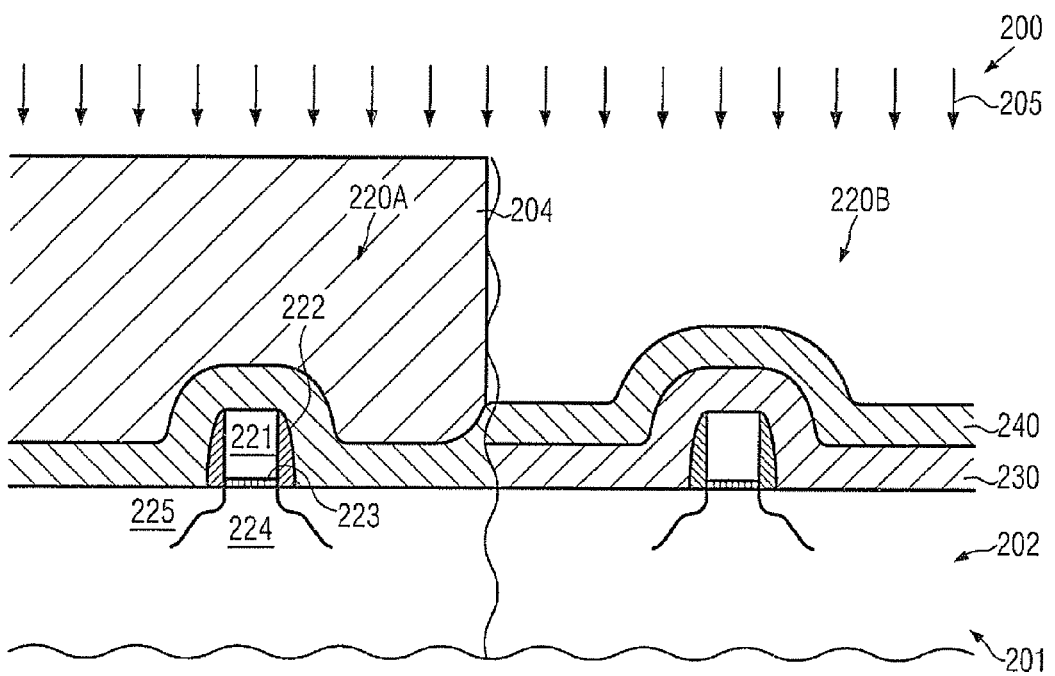
FIGS. 2a-2b schematically illustrate cross-sectional views of device regions including an N-type transistor and a P-type transistor, respectively, during various manufacturing stages for forming stressed dielectric layers of different intrinsic stress above the transistors followed by a buffer layer of reduced stress or with a substantially neutral stress behavior, according to illustrative embodiments disclosed herein.

FIG. 2a schematically illustrates a cross-sectional view of a semiconductor device 200. The device comprises a first device region 220A and a second device region 220B, which may correspond in their basic device architecture to active regions having formed therein one or more transistor elements. Thus, the device regions 220A, 220B may also be referred to as transistors 220A, 220B, if appropriate, wherein it should be appreciated that each of the regions 220A, 220B may also comprise a plurality of transistor elements, which may or may not be bordered by isolation structures (not shown). The transistors 220A, 220B may be located above a substrate 201, which may represent any appropriate carrier material, such as a semiconductor bulk substrate, for instance based on silicon, or an insulating material having formed thereon a substantially crystalline semiconductor layer 202, thereby forming a respective SOI configuration. In one illustrative embodiment, the transistors 220A, 220B may represent circuit elements of a logic circuitry, such as a CPU core. It should be appreciated that the semiconductor device 200 may comprise other device regions, which may include respective transistor elements forming a memory area, such as a static RAM area, in which the respective transistors may require different stress conditions compared to the transistors 220A, 220B. Furthermore, various device regions of the semiconductor device 200 may be formed on the basis of different architectures, such as a bulk configuration or an SOI architecture.

The transistor elements 220A, 220B may each comprise a gate electrode 221 on a gate insulation layer 223 that separates the gate electrode 221 from a corresponding channel region 224, which in turn is flanked by respective drain and source regions 225. In the embodiment shown in FIG. 2a, the respective transistor elements may further comprise a more or less complex sidewall spacer structure 222, depending on device requirements. Furthermore, a highly stressed dielectric layer or stress liner 230 having a high internal compressive stress may be formed above the transistor 220B, wherein it may be assumed that the transistor 220B is a P-channel transistor. It should be appreciated that a high compressive internal stress is to be understood such that the layer 230 acts on the underlying material to result in a compressive strain in the channel region 224 of the transistor 220B. A typical stress level may be approximately 2 GPa and higher. Similarly, a dielectric layer 240 of high internal tensile stress, for instance approximately 1 GPa and higher, may be formed above the first and second transistors 220A, 220B, when the transistor 220A represents an N-channel transistor. Thus, the layer 240 may induce a tensile strain in the channel region 224 of the transistor 220A. In one illustrative embodiment, the layer 230 may be comprised of silicon nitride, carbon-containing silicon nitride, silicon carbide, silicon dioxide and the like, having a high compressive stress, which may amount to 3 GPa and even higher, whereas the layer 240 may be comprised of silicon nitride and the like, having a high tensile stress amounting to approximately 1 GPa and more.

The device 200 may be formed on the basis of similar processes as are described with reference to the device 100. That is, the transistors 220A, 220B may be formed on the basis of well-established techniques, followed by an appropriate dual stress liner approach, in which the layer 230 is deposited on the basis of process parameters in compliance with the desired stress conditions and with respect to the device configuration, i.e., critical dimensions, as previously described. Thereafter, a portion of the layer 230 may be removed from above the transistor 220A by etch techniques, in which control of the etch process may be accomplished on the basis of an etch stop liner (not shown) that may be formed prior to depositing the layer 230. In other cases, the etch stop liner may be omitted. Thereafter, the layer 240 may be deposited on the basis of appropriately selected parameters, wherein an etch indicator layer (not shown) may be formed prior to the deposition of the layer 240. It should be appreciated that, in other cases, the layer 240 may be formed first and, thereafter, the layer 230 may be deposited, which then has to be removed during a subsequent etch process 205.

Figure 1B:
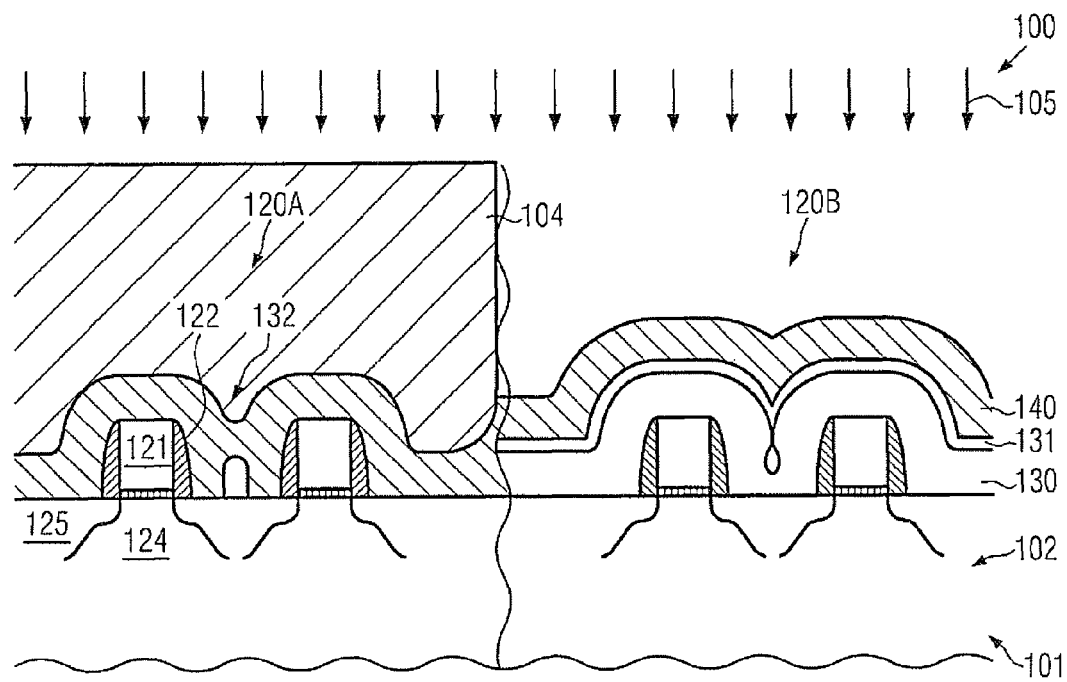
Figure 1C:
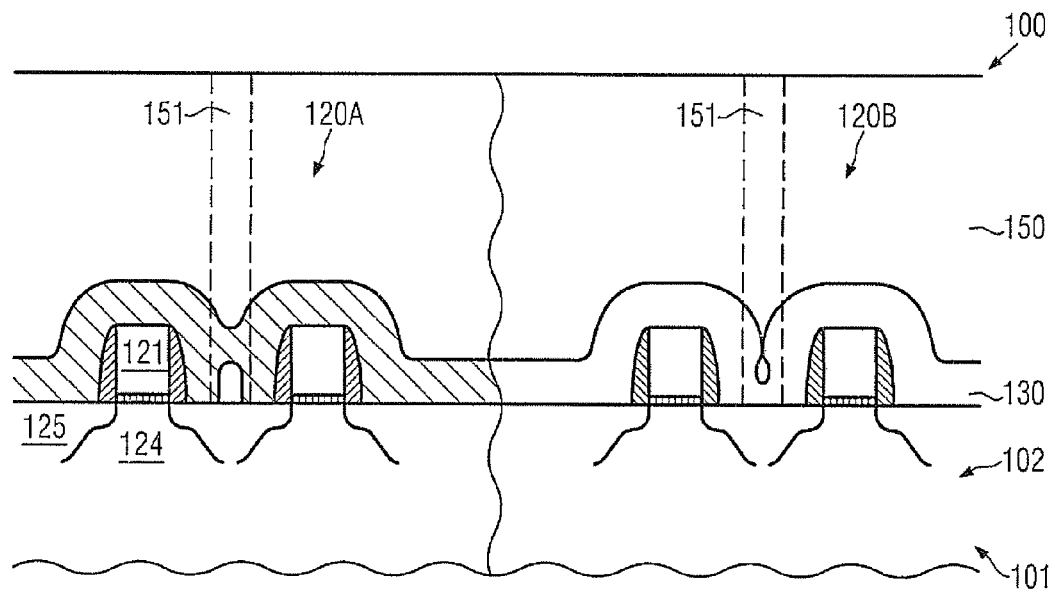

Next, the device 200 may be exposed to the etch ambient 205 in order to remove the layer 240 above the second transistor 220B on the basis of a corresponding resist mask 204. Due to the appropriate selection of the process parameters for forming the layers 230, 240 with high uniformity and high intrinsic stress, the exposed portion of the layer 240 may be substantially completely removed without substantially negatively affecting the layer 230. For instance, the etch process 205 may be performed on the basis of an appropriate etch indicator material, as for instance described with reference to FIGS. 1a-1c, while, in other cases, the corresponding etch indicator layer may be omitted and the etch process 205 may be controlled on the basis of other process parameters, such as etch time and the like. In some illustrative embodiments, the layer 230 may have incorporated therein a significant amount of carbon to represent a silicon/nitrogen/carbon layer, which may also be provided with a internal compressive stress level, while additionally providing a distinguishable endpoint detection signal during the etch process 205 without providing an etch indicator material or offering the possibility of reducing the amount of etch indicator material, thereby also contributing to increased process uniformity. Thereafter, the resist mask 204 may be removed, thereby obtaining the device 200 in a state having the layer 240 in the first device region 220A and the layer 230 in the second device region 220B.

Figure 2B:
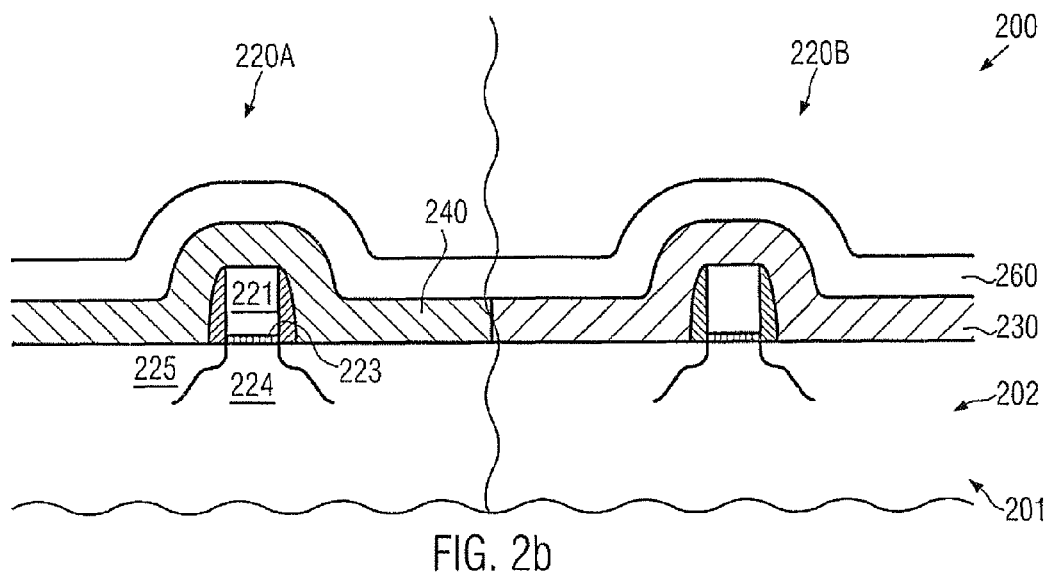

FIG. 2b schematically illustrates the semiconductor device 200 with an additional dielectric layer 260 formed above the first and second transistors 220A, 220B, wherein the additional dielectric layer 260 has a lower internal stress level compared to the layers 230, 240. That is, the additional layer 260 may act on material on which it is formed with a significantly reduced tensile or compressive stress compared to the layers 230, 240, which act on the underlying material with a high compressive and tensile stress. In one illustrative embodiment, the additional layer may have a substantially neutral stress level, that is, the layer 260 may substantially not transfer stress into the layers 230, 240. In one embodiment, the layer 260 may be formed on the layers 230, 240, i.e., the layer 260 may be directly deposited on the layers 230, 240 without providing a further material having a different composition compared to the layer 260. In other cases, a further liner (not shown) may be provided between the layers 230, 240 and the additional layer 260 in order to enhance the controllability of an etch process to etch through the layers 230, 240 and 260 in a later manufacturing stage. In this case, the further liner may have a different material composition to provide a high etch selectivity with respect to the material of the layer 260.

In some illustrative embodiments, the additional layer 260 having the low or neutral stress level may be comprised of a material of high mechanical integrity, such as silicon nitride, which may be formed on the basis of any appropriate recipe, as long as the reduced or neutral stress level is achieved. The term silicon nitride is to include any composition of a silicon and nitrogen containing layer, in which the combined contents of these components represents approximately 80 atomic percent of the entire material. In other cases, the layer 260 may be provided in the form of a silicon and carbon containing layer, which may, in some cases, also comprise a significant portion of nitrogen.

A thickness of the additional layer 260 may range from approximately 100 nm to several nm, when a substantially conformal deposition behavior is desired. However, the material may be provided with a higher thickness. In this case, the further etch stop liner, as previously described, may be provided for enhancing the etch behavior of the entire stack comprising the layers 230, 240 and 260.

It has been found that, by providing the additional layer 260, the overall performance of the transistor 220A, i.e., of the N-channel transistor, may be increased, although the actual internal stress level of the layer is lower or substantially neutral with respect to the layer 230. Without intending to restrict the present disclosure to the following explanation, it is assumed that the layer 260 acts as an efficient buffer layer that improves the overall stress transfer in the N-channel transistor, in which the layer 230 typically has a lower internal stress level compared to the compressive layer 240.

Figure 2C:
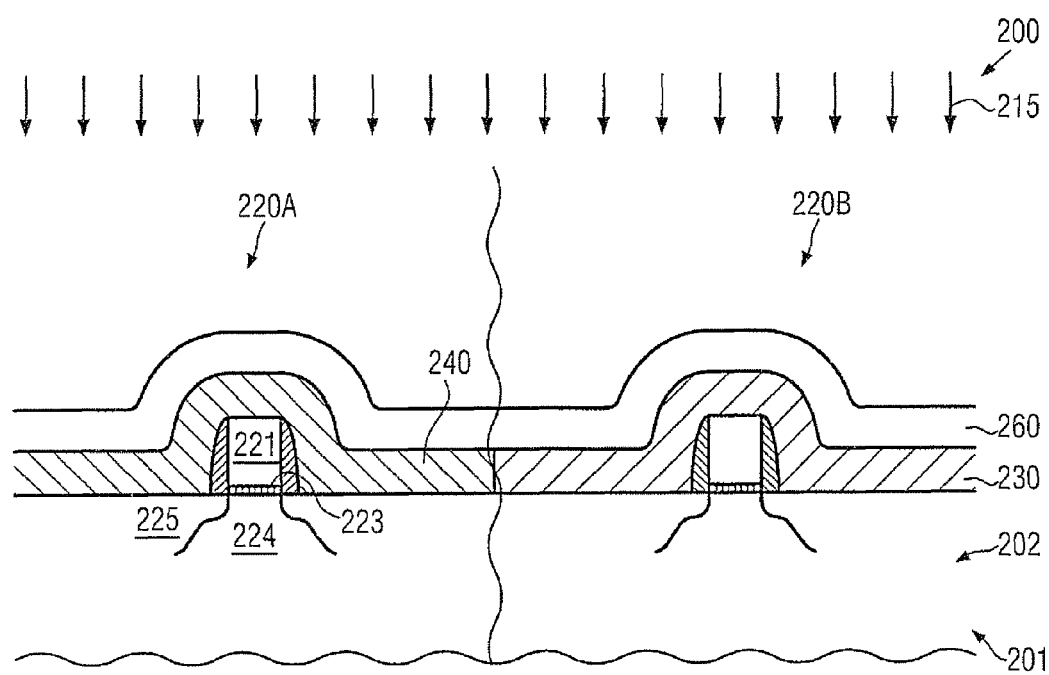
FIG. 2c schematically illustrates a cross-sectional view of the semiconductor device, wherein the additional dielectric material is treated after deposition to adjust material characteristics of the additional dielectric layer, for instance, adjusting the internal stress level, in accordance with illustrative embodiments disclosed herein.

FIG. 2c schematically illustrates the semiconductor device 200 in accordance with further illustrative embodiments. Here, the device 200 is exposed to a treatment 215 for modifying the additional layer 260 or at least a surface portion thereof. For example, the treatment 215 may comprise a thermal treatment, for instance in an oxidizing ambient, at elevated temperatures that are compatible with the device 200 at this manufacturing stage. The thermal treatment may result in the formation of an enhanced surface layer, for instance by incorporating oxygen into a silicon nitride material, which may reduce the interaction with a subsequent deposition process to be performed in a later stage for forming an interlayer dielectric material. Furthermore, the modified surface portion may also impart enhanced mechanical and chemical resistance to the additional layer 260. In other cases, a surface modification may be achieved during the treatment 215 by a plasma assisted process to incorporate one or more appropriate species, such as oxygen, carbon and the like. In other illustrative embodiments, the treatment 215 may comprise an ion implantation process for modifying, i.e., lowering, the stress level in the layer 260. For this purpose, an initially moderately high internal stress level, tensile or compressive, may be reduced by a relaxation implantation on the basis of an appropriate species, such as xenon and the like.

Figure 2D:
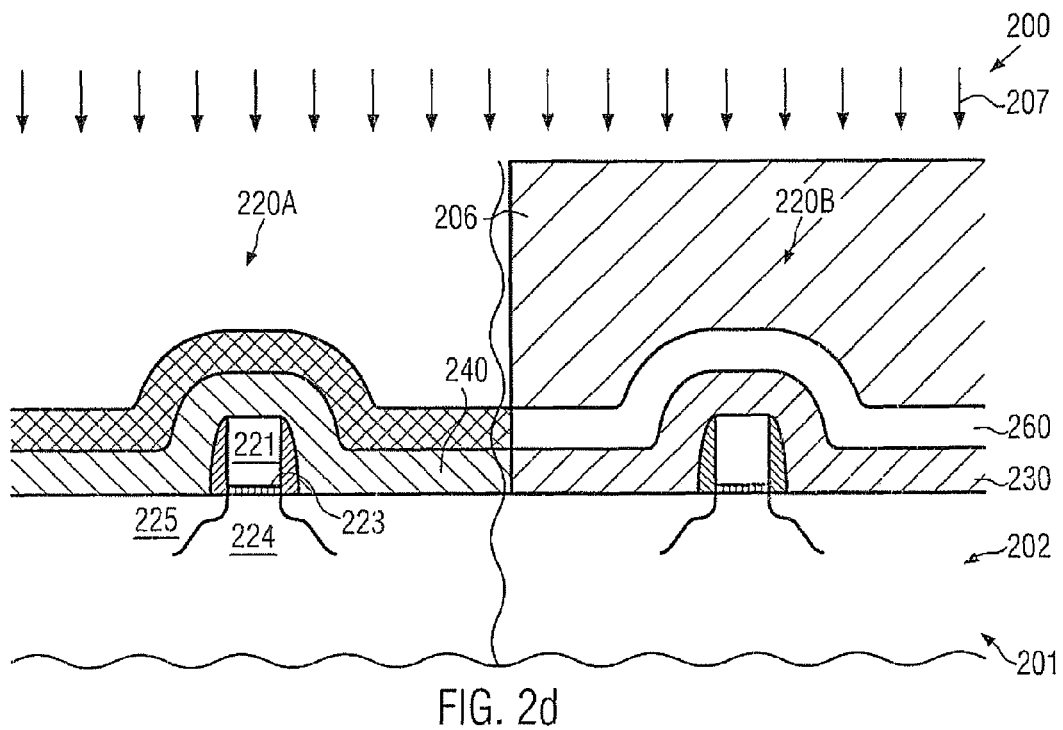
FIG. 2d schematically illustrates a cross-sectional view of the semiconductor device during a treatment by ion bombardment for selectively adjusting the internal stress level of the additional dielectric layer above the N-channel transistor, according to further illustrative embodiments disclosed herein.

FIG. 2d schematically illustrates the semiconductor device 200 in accordance with further illustrative embodiments. Here, the device 200 comprises a mask 206 for covering the second transistor 220B while exposing the first transistor 220A to a selective surface modification treatment 207. The process 207 may be designed in a similar manner as is described with reference to the treatment 215, while providing a spatially different degree of modification. In the embodiment shown, the mask 206 may represent a resist mask to locally "pattern" the treatment 207 that may be designed to reduce the intrinsic stress of the layer 260, which may be a compressive stress, due to deposition-dependent characteristics, in order to not unduly reduce performance of the transistor 220A. In one illustrative embodiment, the modification process 207 may represent an ion implantation process performed on the basis of an appropriate implantation species, such as inert material, for instance, xenon, argon and the like. Thus, the implantation process may efficiently modify the molecular structure of the exposed portion of the layer 260, thereby significantly relaxing the intrinsic stress. Appropriate process parameters for the process 207 may be readily determined on the basis of simulation calculations, experiments and the like. Thereafter, a further treatment, such as the treatment 215, may be performed for both transistors 220A, 220B, when, for instance, increased mechanical and chemical integrity may be required due to the preceding treatment 207.

Figure 2E:
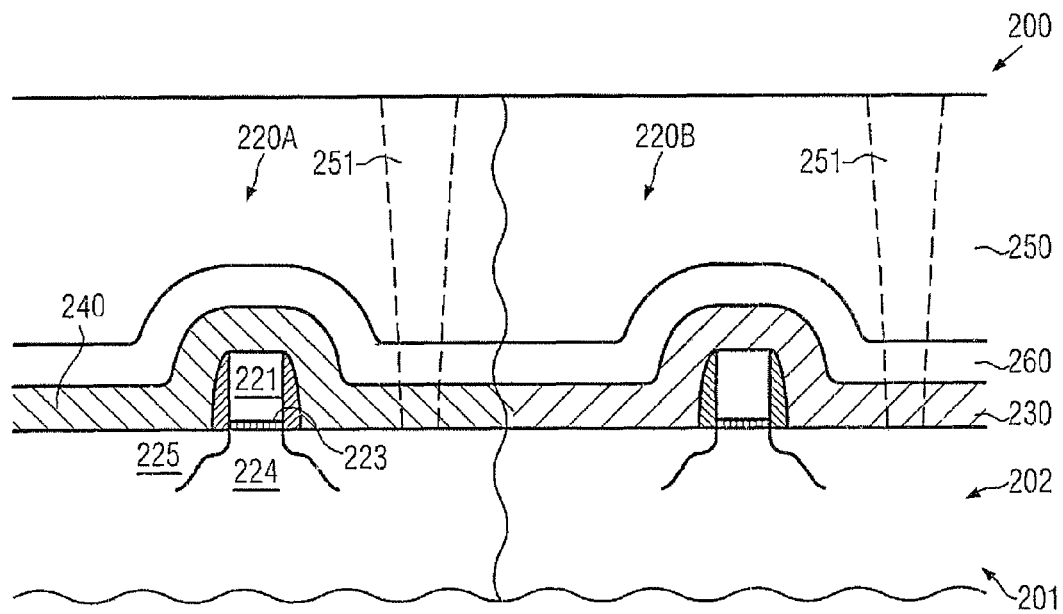
FIG. 2e schematically depicts a cross-sectional view of the semiconductor device having an interlayer dielectric material which may be patterned to form contact openings on the basis of the stressed dielectric layers and the additional dielectric layer having the reduced internal stress level, according to further illustrative embodiments disclosed herein.

FIG. 2e schematically illustrates the semiconductor device 200 in a further advanced manufacturing stage. A respective interlayer dielectric material 250 may be formed above the first and second transistors 220A, 220B, for instance, in the form of silicon dioxide and the like. The dielectric material 250 may be formed on the basis of well-established techniques, as previously described with reference to the device 100. In a next manufacturing process, respective openings 251 may be formed, as indicated by the dashed lines, wherein a high degree of process uniformity may be achieved due to the appropriate adaptation of the corresponding layer thickness during the preceding formation of the layers 230, 240. During the respective etch process, the layer 260 may act as an etch stop layer due to the different material compositions of the interlayer dielectric material 250 and the additional dielectric layer 260. Moreover, the surface portion of the layer 260 may have been modified during the treatments 215 and/or 207 so as to even further enhance the etch behavior, if desired. Thereafter, the layer 260 and the layers 230, 240 may be etched on the basis of well-established recipes, wherein, in some cases, as previously explained, an additional etch stop liner or etch indicator liner or etch indicator species may be provided between the layers 230, 240 and the layer 260.

As a result, the subject matter disclosed herein provides a technique for enhancing transistor performance for an N-channel transistor in highly scaled semiconductor devices by forming an additional dielectric material on previously patterned dielectric layers of different types of intrinsic stress, wherein the additional dielectric material has a significantly lower internal stress level compared to the stress layers, thereby providing a substantially neutral stress behavior. It has been found that this additional dielectric layer may result in performance gain of N-channel transistors. Hence, process limitations imposed by a device configuration under consideration and the capabilities of the respective deposition processes, possibly in combination with subsequent processes, such as the formation of etch indicator layers, etch stop layers and the like, which may optionally be provided during the patterning of the initial dielectric layers of different intrinsic stress, may be respected, for instance by using a reduced layer thickness for the actual stress-inducing layers. The additional dielectric layer may thus locally provide enhanced strain conditions in N-channel transistors, while substantially not affecting the performance of the P-channel transistors. Furthermore, the additional layer may act as a buffer layer with respect to further surface treatments that may be desirable in view of process and device improvements substantially without affecting the overall stress conditions in the transistor level. For example, plasma treatments, thermal treatments, ion implantations and the like may be performed on the basis of the additional dielectric layer, while the desired stress behavior and thus performance is "preserved" by the additional dielectric layer. For example, measurements indicate an overall performance gain of approximately 4% for N-type transistors, without a performance loss of the P-type transistors, for devices having the additional dielectric layer compared to devices without this layer.

The provision of the additional material may be advantageously combined with any appropriate patterning sequence for providing differently stressed dielectric layers above different transistor types, independently from the corresponding process sequence used. That is, the compressive dielectric material may be provided first and subsequently a tensile dielectric material may be patterned, wherein afterwards one or more additional stressed dielectric materials may be provided with compressive and/or tensile stress. Similarly, a sequence may be used in which the tensile dielectric material may be provided first followed by the compressive dielectric material, while the additional dielectric material may be provided with a reduced tensile or compressive stress, or as a substantially "stress-neutral" material depending on the process and device requirements. Hence, a process sequence is provided for forming a highly stressed material in a device geometry complying manner, while additionally increasing the performance of the N-channel transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first stress-inducing layer above a first transistor formed above a substrate, said first stress-inducing layer generating a first type of stress;
    forming a second stress-inducing layer above a second transistor, said second stress-inducing layer generating a second type of stress other than said first type of stress;
    forming a third dielectric layer above said first and second transistors and in direct contact with said first and second stress-inducing layers, said third dielectric layer having an internal stress level above said first transistor that is less than that of said first and second stress-inducing layers;
    forming an interlayer dielectric material above said first and second transistors; and
    forming contact openings in said interlayer dielectric material by using said third dielectric layer as an etch stop material for the etching of said interlayer dielectric material.

2. The method of claim 1, wherein said internal stress level of said third dielectric layer is substantially neutral.

3. The method of claim 1, wherein said third dielectric layer is comprised of silicon nitride.

4. The method of claim 1, wherein said third dielectric layer comprises silicon and carbon.

5. The method of claim 1, wherein an internal stress level of the third dielectric layer above said second transistor is substantially equal to said internal stress level above said first transistor.

6. The method of claim 1, wherein forming said third dielectric layer comprises depositing material of said third dielectric layer above said first and second transistors and treating the deposited material to adjust said internal stress level.

7. The method of claim 6, wherein said treatment is performed to selectively adjust said internal stress level above said first transistor.

8. The method of claim 6, wherein said treatment is performed commonly for said first and second transistors.

9. The method of claim 6, wherein said treatment comprises performing an ion implantation process.

10. The method of claim 6, wherein said treatment comprises performing at least one of a thermal process and a plasma process.

11. The method of claim 1, wherein said first and second stress-inducing layers comprise silicon and nitrogen.

12. The method of claim 1, wherein at least one of said first and second stress-inducing layers comprises silicon and carbon.

13. The method of claim 1, wherein said first transistor represents an N channel transistor.

14. The method of claim 1, wherein a thickness of said third dielectric layer is approximately 100 nm and less.

15. A method, comprising:
    forming a first dielectric layer above a P-channel transistor, said first dielectric layer inducing a compressive strain in a channel region of said P-channel transistor;
    forming a second dielectric layer above an N-channel transistor, said second dielectric layer inducing a tensile strain in a channel region of said N-channel transistor;
    forming a third dielectric layer above said P-channel transistor and said N-channel transistor and in direct contact with said first and second dielectric layers, said third dielectric layer having an internal stress level that is less than an internal stress level of said first and second dielectric layers;
    depositing an interlayer dielectric material above said third dielectric layer; and
    forming contact openings in said interlayer dielectric material by using said third dielectric layer as an etch stop material for the etching of said interlayer dielectric material.

16. The method of claim 15, wherein said third dielectric layer comprises silicon and nitrogen.

17. The method of claim 15, wherein forming said third dielectric layer comprises conformally depositing material of said third dielectric layer and adjusting said internal stress level by treating said material by performing at least one of an ion implantation process, a thermal treatment and a plasma treatment.

18. The method of claim 15, wherein said internal stress level of said third dielectric layer is substantially neutral.

19. A semiconductor device, comprising:
- a first dielectric layer formed above a first transistor, said first dielectric layer inducing a first type of stress;
- a second dielectric layer formed above a second transistor, said second dielectric layer inducing a second type of stress other than said first type;
- a third dielectric layer formed in direct contact with said first and second dielectric layers, said third dielectric layer having an internal stress level that is less than an internal stress level of said first and second dielectric layers; and
- an interlayer dielectric material formed above said third dielectric layer, said interlayer dielectric material having a thickness that is greater than a combined thickness of said first and third dielectric layers.

20. The semiconductor device of claim 19, wherein said third dielectric layer is comprised of silicon nitride.

21. The semiconductor device of claim 19, wherein said first and second transistors have a gate length of approximately 50 nm or less.

22. The semiconductor device of claim 19, wherein said first and second dielectric layers contain silicon and nitrogen.

23. The semiconductor device of claim 19, wherein a combined thickness of said first and third dielectric layers is approximately 200 nm or less.

* * * * *